United States Patent [19]
Turner et al.

[11] Patent Number: 5,247,195
[45] Date of Patent: Sep. 21, 1993

[54] PLDS WITH HIGH DRIVE CAPABILITY

[75] Inventors: John E. Turner, Santa Cruz; Om P. Agrawal, San Jose, both of Calif.

[73] Assignee: Advanced Micro Devices, Inc., Sunnyvale, Calif.

[21] Appl. No.: 736,205

[22] Filed: Jul. 26, 1991

[51] Int. Cl.$^5$ ............................................. H01L 23/02
[52] U.S. Cl. ...................................... 257/203; 307/475
[58] Field of Search .................... 307/465, 257, 475; 357/74; 257/691, 203, 207, 209

[56] References Cited

U.S. PATENT DOCUMENTS

| | | | |
|---|---|---|---|
| 4,930,097 | 5/1990 | Ledenbach et al. | 307/465 |
| 4,930,098 | 5/1990 | Allen | 307/465 |
| 5,003,204 | 3/1991 | Cushing et al. | 307/465 |

OTHER PUBLICATIONS

PLX Technology Corporation, PLX448, Data Sheet (Jan. 1988).
PLX Technology Corporation, PLX464, Data Sheet and Announcement (Sep. 1988).
"Advanced Micro Devices Offers 64mA-Output PLD" Electronic News, Feb. 18, 1991, p. 18.

Primary Examiner—rolf Hille
Assistant Examiner—Roy Potter
Attorney, Agent, or Firm—Fliesler, Dubb, Meyer & Lovejoy

[57] ABSTRACT

An industry standard programmable logic device capable of driving up to 64 milliamps in the output low state and up to 15 milliamps in the output high state. An output macrocell is described for use with such a driver, which includes a user-selectable D/T flip-flop, input hysteresis, and a programmable individually bypassable input latch with a common latch enable.

25 Claims, 4 Drawing Sheets

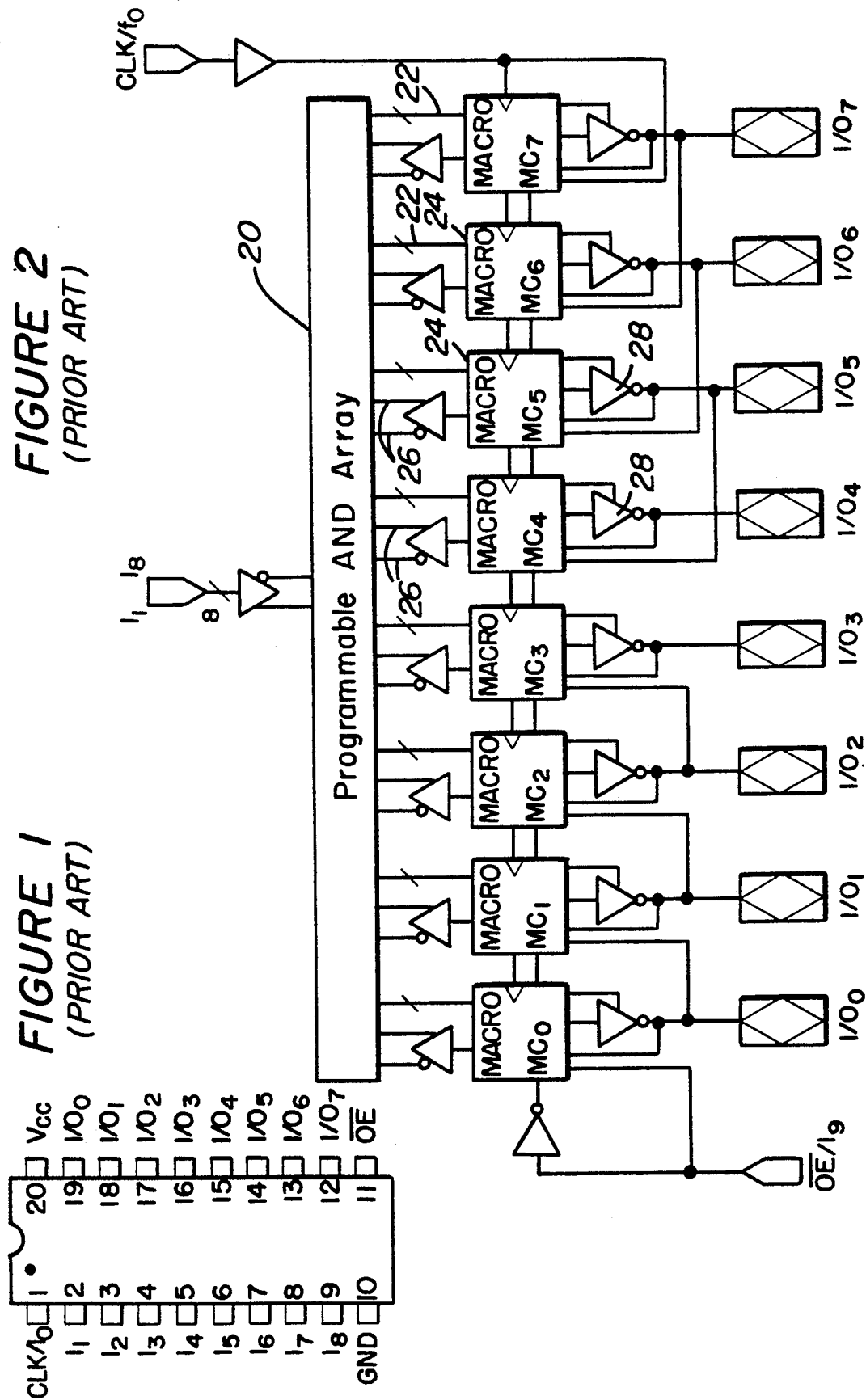

PLDS WITH HIGH DRIVE CAPABILITY

BACKGROUND OF THE INVENTION

1. Field of the Invention

The present invention relates to programmable logic devices, and more particularly, to an enhancement for existing industry standard programmable logic devices.

2. Description of the Related Art

The programmable logic device (PLD) industry has developed over the last several years to the point where a small number of PLD architectures dominate the industry, especially the industry for low density PLDs. As of the present date, these architectures, roughly described, are as follows:

16L8 A 20-pin device having 10 dedicated inputs, 2 dedicated combinatorial outputs, and 6 bi-directional I/O leads. The programmable array is made up of a programmable AND array followed by a fixed OR array, and each of the dedicated and bi-directional leads receives a respective output enable which is provided by the array. One ground lead and one power supply lead are provided.

16R8 A 20-pin device having 8 dedicated registered outputs, a clock input for clocking all the registers in common, and an output enable input for enabling the 8 outputs in common. The programmable array consists of a programmable AND array followed by a fixed OR array. One power and one ground lead are provided.

16R6 A 20-pin device having 8 dedicated inputs, 6 dedicated registered outputs, 2 bi-directional combinatorial outputs, a clock input for clocking all the registers in common, and an output enable input for enabling the 6 dedicated outputs in common. Two independent output enables are provided by the array for the two combinatorial outputs. The programmable array consists of a programmable AND array followed by a fixed OR array, and one power and one ground lead are provided. 16R4 A 20-pin device having 8 dedicated inputs, 4 dedicated registered outputs, 4 bi-directional combinatorial outputs, a clock input for clocking all the registers in common, and an output enable input for enabling the 4 dedicated outputs in common. Four independent output enables are provided by the array for the four combinatorial outputs. The programmable array consists of a programmable AND array followed by a fixed OR array, and one power and one ground pin are provided.

20L10 A 24-pin device having 12 dedicated inputs, 2 dedicated combinatorial outputs, and 8 bi-directional combinatorial I/O leads. The programmable array is made up of a programmable AND array followed by a fixed OR array, and each of the dedicated bi-directional leads receives a respective output enable which is provided by the array. One ground lead and one power supply lead are provided.

20L8 A 24-pin device having 14 dedicated inputs, 2 dedicated combinatorial outputs, and 6 bi-directional I/O leads. The programmable array is made up of a programmable AND array followed by a fixed OR array, and each of the dedicated and bi-directional leads receives a respective output enable which is provided by the array. One ground lead and one power supply lead are provided.

20R4 A 24-pin device having 12 dedicated inputs, 4 dedicated combinatorial bi-directional leads, 4 dedicated registered outputs, an output enable input and a clock input. The programmable array is made up of a programmable AND array followed by a fixed OR array. The output enable input controls the 4 registered outputs in common, and the clock input is provided to the 4 registers in common. Each of the bi-directional leads receives a respective output enable which is provided by the array. One ground lead and one power supply lead are provided.

20R6 A 24-pin device having 12 dedicated inputs, 6 dedicated registered outputs, 2 bi-directional combinatorial I/O leads, an output enable and a clock input. The programmable array consists of a programmable AND array followed by a fixed OR array. The output enable controls the 6 registered outputs, and the clock input is also provided to each of the 6 registers. Each of the bi-directional leads receives a respective output enable which is provided by the array.

20R8 A 24-pin device having 12 dedicated inputs, 8 registered outputs, a common output enable input provided to all the registered outputs and a common clock input provided to all the registers. The programmable array consists of a programmable AND array followed by a fixed OR array. One power and one ground pin are provided.

22V10 A 24-pin device having 11 dedicated inputs, 10 bi-directional outputs, and a shared data input/clock input. The array consists of a programmable AND array and a fixed OR array, and 10 of the array outputs are provided to the 10 respective bi-directional output leads via 10 respective output logic macrocells. Each macrocell can provide to its respective output a true or complement, registered or combinatorial, version of its input. A common asynchronous reset and a common synchronous preset are also provided to the macrocells from the array.

16V8 A 20-pin device having 8 dedicated inputs, 8 bi-directional outputs, an output enable input, and a clock input. The array consists of a programmable AND array and a substantially fixed OR array, and 8 of the array outputs are provided to the 8 respective bi-directional output leads via 8 respective output logic macrocells. Each macrocell can provide to its respective output a true or complement, registered or combinatorial, version of its input. The output enables are individually programmable to be high, low, responsive to the externally supplied output enable signal, or responsive to a respective AND array output.

20V10 A 24-pin device having 12 dedicated inputs, 8 bi-directional outputs, a thirteenth input which doubles as an output enable input, and fourteenth input which doubles as a clock input. The array consists of a programmable AND array and a substantially fixed OR array, and 8 of the array outputs are provided to the 8 respective bi-directional output leads via 8 respective output logic macrocells. Each macrocell can provide to its respective output a true or complement, registered or combinatorial, version of its input. The output enables are individually programmable to be high, low, responsive to the externally supplied output enable signal, or responsive to a respective AND array output.

All the above PLD architectures are described in various manufacturers' data books, for example, the "PAL Device Data Book" published by Advanced Micro Devices, copyright date 1990. The PAL Device Data Book is incorporated herein by reference.

These PLD architectures, and a few others, have each been widely accepted among PLD users. They are also available from a number of different manufacturers, all of which continue to use the above designators (e.g. "16L8", "22V10") to identify them as having the same internal architecture. The designators have also become widely recognized in the market as having particular, known architectural cores. There are numerous other varieties of PLD architectures available on the market, but they have not achieved the level of acceptance that has been achieved by the above devices. Thus they cannot be considered industry standard PLD architectures.

Industry standard PLD's generally have outputs which can supply a maximum of 16 to 24 milliamps in the low state and 3.2 milliamps in the high state. This output capability is adequate for driving 10 to 16 TTL loads, and therefore permits PLD's to be used in a wide variety of on-board logic-related applications. This drive capability is generally not enough for bus driving applications, however. For example, some of the most popular buses, such as the VME bus, require 48-64 milliamp drive capability. For bus driving applications, designers of board level products which incorporate PLD's have generally inserted dedicated bus interface elements between the PLD's and the bus. Such bus interface elements include bus interface registers, bus interface latches, bus buffers, bus interface transceivers and parity bus transceivers. Insertion of such elements between the PLD and the bus both increases the required board space and degrades performance.

Recently, some manufacturers have begun manufacturing PLD's with higher drive capability. Extra ground and power pins are generally required to support the extra drive capability, however, and these manufacturers have chosen to provide such extra pins by changing or cutting back the internal architecture of a device. For example, the PLX448, from PLX Technology Corp., is a 24-pin PLD with 9 dedicated inputs with hysteresis, one dedicated clock input, one combined clock/data input with hysteresis, and 8 bi-directional outputs with macrocells. The programmable array consists of a programmable AND array followed by a fixed OR array. Four of the bi-directional outputs can drive 24 milliamps in the low state, and the other four can drive up to 48 milliamps in the low state. As another example, the PLX464 has substantially the same architecture as the PLX448 except that it has four 48 milliamp drivers and four 64 milliamp drivers. The PLX448 and PLX464 and their data sheets are incorporated herein by reference.

Although the architectural core of the PLX448 and PLX464 can in some ways be considered to be somewhere between a 16V8 and a 22V10, the devices cannot be considered to be industry standard PLDs since they are not second sourced by any other manufacturer, and since their architectural core is not widely known in the market. Thus it is necessary for the manufacturer to explain to customers how the architecture differs from industry standard architectures such as the 16V8 and 22V10. That necessity can reduce the marketability of the devices.

SUMMARY OF THE INVENTION

According to the invention, instead of deviating from industry standard architectures in order to package high-drive PLDs in the same package size, a PLD is provided which has an industry standard architecture, or a functional superset thereof which maintains upward compatibility without degradation of speed or cost, in the next larger standard package size. For example, since a 16V8 is packaged in a 20-pin package, a high drive version of the 16V8 should be packaged in a 24-pin package. In order to improve ground bounce characteristics, the four newly available pins are used for ground or power supply connections. Thus, a system designer can use a familiar, industry standard PLD architecture in bus interface applications without requiring the insertion of dedicated bus interface hardware.

BRIEF DESCRIPTION OF THE DRAWINGS

The invention will be described with respect to particular embodiments thereof, and reference will be made to the drawings in which:

FIG. 1 is a symbolic drawing of a standard integrated circuit package;

FIG. 2 is a block diagram of a prior art 16V8 device;

DETAILED DESCRIPTION

Figure 3:
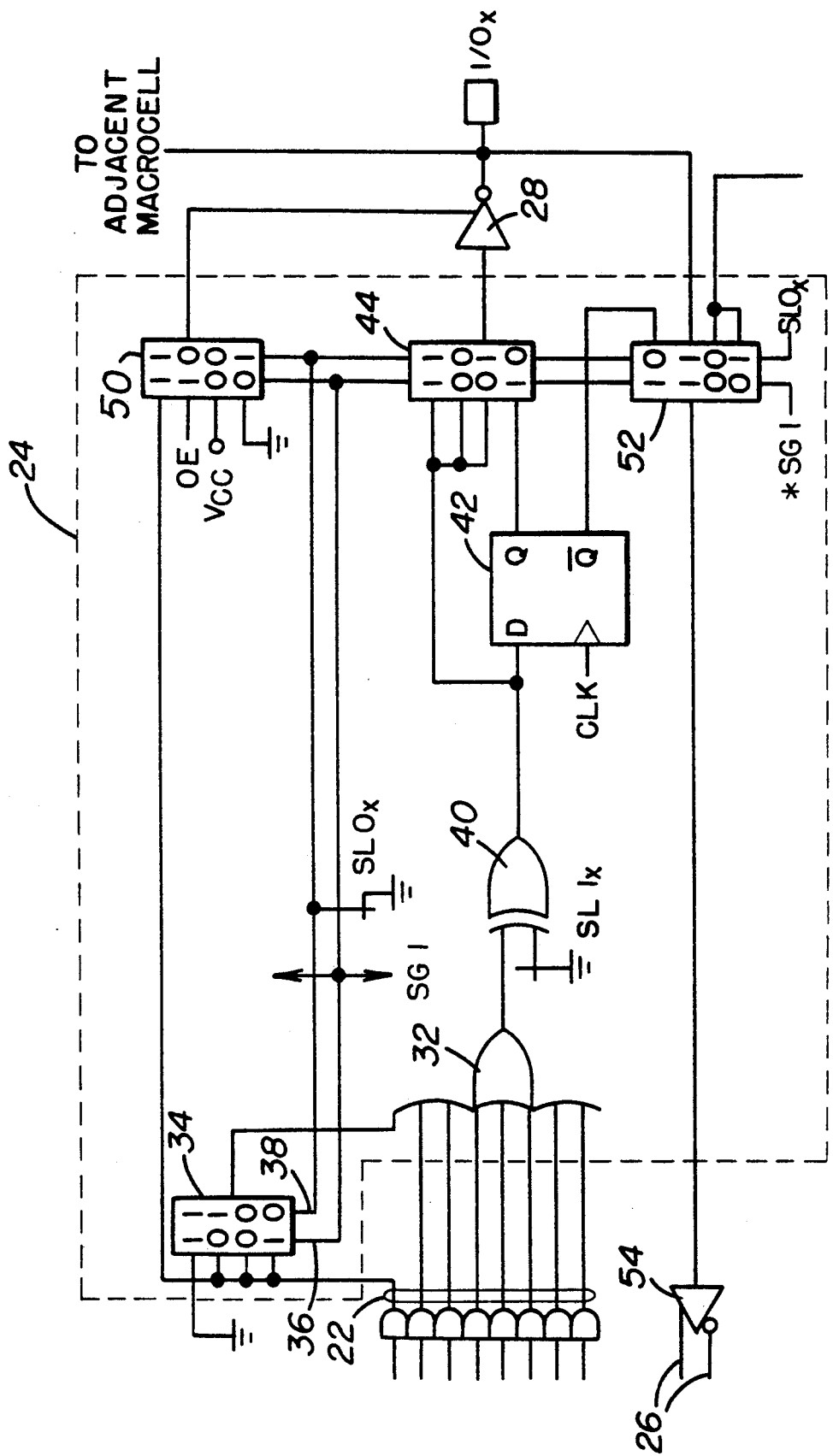
FIG. 3 is a block diagram showing the internal logic functions of the macrocells of FIG. 2.

In FIG. 1 there is shown a symbolic diagram of a 20-pin dual in line (DIP) package containing a 16V8 programmable logic device. The package is an industry standard 20-pin package. Industry standard 16-pin, 24-pin and 28-pin packages are also available. Inbetween sizes are also available, but they are not as widely used as the 16-, 20-, 24- and 28-pin varieties.

The 16V8 is an industry standard PLD, incorporating an industry standard internal architecture. As shown in FIG. 2, it incorporates 8 dedicated inputs, 8 bi-directional leads, a clock input which doubles as an additional input, and an output enable input which also doubles as an additional input. All the inputs are connected to a programmable AND array 20, which generates 8 outputs 22 supplied to respective macrocells 24. Each of the macrocells in turn supply feedback signals to the programmable AND array 20 over lines 26. Each of the macrocells further provides an output signal to a respective inverting 3-state buffer 28, the output of which is connected both to the respective I/O lead and back to the macrocell for feedback purposes. The output enable for the 3-state buffers are each provided by the respective macrocell. Six of the I/O leads are also connected as inputs for feedback purposes to respective adjacent ones of the macrocells. One of the remaining macrocells receives the output enable input as an input for feedback purposes, and the last remaining macrocell receives the clock input as an input for feedback purposes.

FIG. 3 shows a detailed block diagram of one of the macrocells 24. As can be seen, the outputs 22 from the AND array 20 consist of 8 product terms, 7 of which are provided directly to 7 inputs of an 8-input OR gate 32. The 8th product term is connected to 3 inputs of a 4-input multiplexer 34, the 4th input of which is connected to ground. Select inputs 36 and 38 form a 2-bit binary select for the multiplexer 34, the output of which is provided to the 8th input of OR gate 32. Select input 36 is connected to a programmable global cell SG1, which is connected to the corresponding select inputs 36 of all the macrocells in the device. The select input 38 is connected to a programmable local cell SL0$_x$. The output of OR gate 32 is connected to one input of an exclusive OR gate 42, the other input of which is connected to a local programmable cell SL1$_x$. The output of exclusive OR gate 40 is connected both to the D input of a D flip-flop 42, and also to 3 inputs of a 4-input output multiplexer 44. The Q output of the flip-flop 42 is connected to the 4th input of an output multiplexer 44, and the output of multiplexer 44 is connected to the input of the 3-state buffer 28 described with respect to FIG. 2.

In addition to being supplied to 3 inputs of multiplexer 34, the 8th product term in the group 22 is also provided to one input of a 4-input OE multiplexer 50. A second input of OE multiplexer 50 is connected to receive the output enable input shown in FIG. 2. A 3rd input to the multiplexer 50 is connected to ground and a 4th is connected to Vcc. The output of OE multiplexer 50 provides the output enable signal for the 3-state buffer 28.

The $\overline{Q}$ output of flip-flop 42 is connected to one input of a feedback multiplexer 52, the output of which is provided to the feedback lines 26 via a feedback buffer 54. A second input to the feedback multiplexer 52 is connected to the I/O lead, and the 3rd and 4th inputs to the feedback multiplexer 52 are both connected to receive the external signal as shown for each particular macrocell in FIG. 2. The select lines for each of the multiplexers 44, 50 and 52 are connected to the same programmable cells SG1 and SL0$_x$ which are connected to the select inputs 36 and 38 of multiplexer 34, except that for macrocells MC$_0$ and MC$_7$ as shown in FIG. 2, SG1 is replaced by $\overline{SG0}$ in the feedback multiplexer 52. Although the OR gate 32 summing the product terms 22 is shown inside the macrocell 24, since the placement of particular logic functions inside or outside various diagrammatic boxes is substantially arbitrary, it can be seen that the 16V8 of FIG. 2 comprises a programmable AND array followed a substantially fixed OR array. Also, it should be noted that at the transistor level, an AND array followed by an OR array is often implemented using wire NANDs and wire NORs as appropriate for the particular fabrication technology being used. Logically, however, a sum of products function is being performed.

Figure 4:
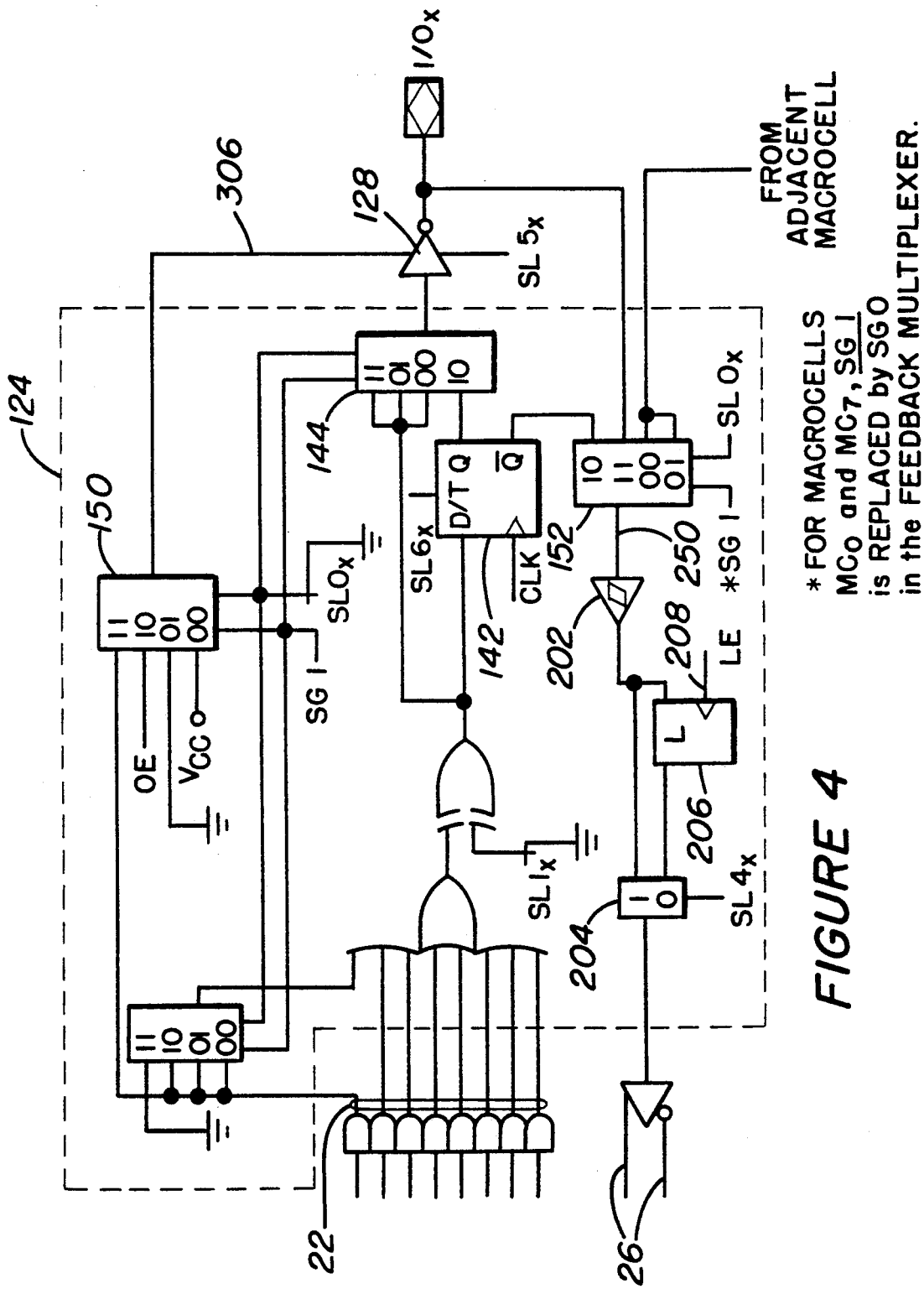
FIG. 4 is a block diagram showing the internal logic functions of a modified macrocell according to the invention.

FIG. 4 is a block diagram of a modified macrocell 124 which replaces the macrocells 24 in FIG. 2. It is a functional superset of the macrocell 24 since it incorporates all of the features (programmable options) of macrocell 24 with some additions. It has only slightly increased functionality, however, so the user can choose not to use the additions and instead treat the architecture as if it were that of a 16V8. In particular, the D flip-flop 42 in macrocell 24 is replaced by a D/T flip-flop 142 which is programmable, using a local cell SL6x, to operate either as a D flip-flop or as a T flip-flop. Second, a hysteresis circuit 202 is incorporated into the feedback path following the output of multiplexer 152, and the output of the hysteresis circuit 202 is provided to a 2-input multiplexer 204 both directly and via a transparent latch 206. The selection made by multiplexer 204 is controlled by another local programmable cell SL4x, and the output of the multiplexer 204 is connected to the input of the buffer which generates the feedback signals 26. The latch enable input 208 to the transparent latch 206 is common to the input latches in all the macrocells 124 on the modified PLD. Although the various elements in the PLD are shown as logical functional blocks, such as a multiplexer and a latch, it will be understood that at the circuit level many of these logical functions can be combined with others, divided among others, and/or moved to a physically different place in the actual circuit implementation.

Each of the modifications described above renders the modified PLD architecture more suitable for bus driving applications. In particular, the modification of D flip-flop 42 to a programmable D/T flip-flop 142 accommodates the toggling nature of various bus signals as defined in some bus protocols. The hysteresis circuit 202 is useful to accommodate the greater level of noise common on long bus lines, and the latch 206, with a common enable 208, permits the device to latch up to 8 bits of parallel data arriving from the bus. Importantly, the individually programmable latch bypass multiplexer 204 provides the designer with flexibility to reduce the number of latched inputs below 8, and to locate them at any desired I/O leads. The individually programmable latch bypass multiplexer 204 also allows the user to synchronize only selected ones of an external asynchronous input signal.

Although not shown in the figures, the 8 dedicated inputs of the modified device are also modified to incorporate a hysteresis circuit followed by a bypassable transparent latch. The latch enables for all of the input latches are common and driven by one of the dedicated inputs.

Figure 5:
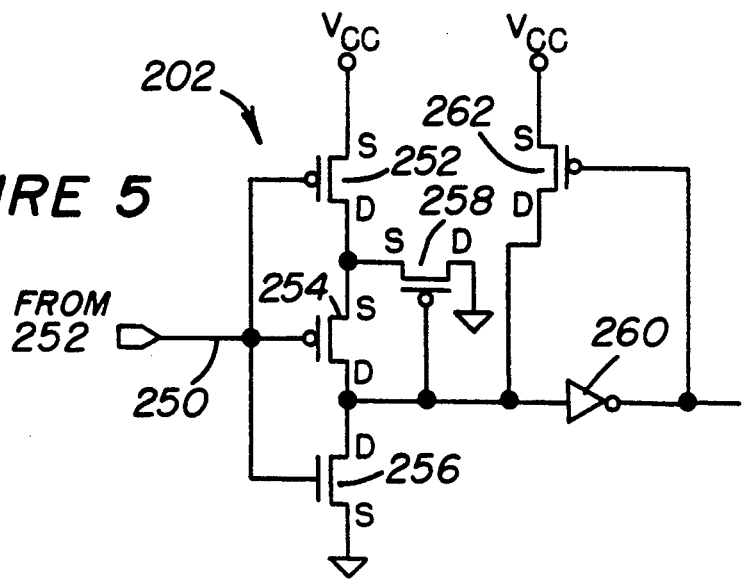
FIG. 5 is a schematic of a hysteresis circuit shown in FIG. 4.

FIG. 5 shows a schematic diagram of input hysteresis circuit 202 (FIG. 4). The circuit is balanced so as not to degrade performance in a single direction. The input signal, from feedback multiplexer 152, is connected to the gates of a P-channel transistor 252, a P-channel transistor 254 and an N-channel transistor 256. The source of transistor 252 is connected to Vcc, and its drain is connected to the source of transistor 254. The drain of transistor 254 is connected to the drain of transistor 256, the source of which is connected to ground. Although the current path terminals of various transistors are described herein as being source or drain, it will be understood that because of the equivalence between source and drain in FET transistors, these designations may be reversed. The drain of transistor 256 is also connected to the gate of a P-channel transistor 258, the source of which is connected to the drain of transistor 252, and the drain of which is connected to ground. The drain of transistor 256 is further connected to the input of an inverter 260, the output of which is connected back to the gate of a transistor 262. The source of transistor 262 is connected to Vcc, and the drain is connected to the drain of transistor 256. The output of inverter 260 forms the output of hysteresis circuit 202.

To understand the operation of the hysteresis circuit 202, first assume that the input line 250 is in a steady low state. In this condition, transistor 252 is on and transistor 256 is off. Since transistor 252 is on, the source of transistor 254 is close to Vcc. Since the input 250 is low, transistor 254 will also conduct, thereby pulling up the voltage at the drain of transistor 256 to a level close to Vcc. This further turns off transistor 258, preventing it from pulling the drain of transistor 252 low. Feedback through inverter 260 and transistor 262 also helps hold the drain of transistor 256 at a high level.

This condition is stable until the voltage on the input 250 begins to rise. As it does, transistor 256 gradually turns on and transistors 252 and 254 gradually turn off, thereby providing a slowly falling voltage level at the drain of transistor 256. The voltage on the drain of transistor 252 is falling even more gradually than the voltage on the drain of transistor 256. Only when the difference between those two voltages exceeds one threshold voltage $V_T$ will transistor 258 begin to turn on. As it does, it begins to cause the drain of transistor 252 to fall more quickly, thereby permitting the drain of transistor 256 to fall more quickly, and thereby re-enforcing the effects of transistor 258. Thus, a rising voltage on input 250 will be reflected as a falling voltage on the drain of transistor 256 only after a hysteresis delay. Should the rising voltage on the input 250 not reach a predetermined threshold voltage, or not remain there long enough, as is usually the case with noise, the voltage on the drain of transistor 256 will not respond.

Now assume the signal on line 250 is at a steady high voltage. In this situation transistors 252 and 254 are both off, and transistor 256 is on. The voltage at the drain of transistor 256 is therefore low, thereby also keeping transistor 258 turned off. As the signal on line 250 begins to fall, transistor 252 begins to conduct current. As it does, the voltage at the source of transistor 254 begins to rise. The rise is not transmitted to the drain of transistor 256 yet, however, since transistor 258, with its gate low and its source rising, shunts most of transistor 252's current to ground. Only when the voltage on line 250 falls far enough, or for a long enough period of time, will transistor 254 conduct a significant amount of current and begin to pull the drain of transistor 256 high. At about the same time, transistor 256 begins to turn off. Finally, only after the voltage on line 250 falls below a predetermined threshold hysteresis level, will the drain of transistor 256 reach a steady high level.

The inverter 260 has an input threshold voltage which will prevent any output change unless the voltage on the drain of transistor 256 changes from its standard high and low voltage levels by more than predetermined respective threshold amounts. The feedback transistor 262 functions as a squaring circuit to reinforce any true changes in the input value that does reach the output of inverter 260.

Returning to FIG. 4, another modification from the circuitry shown in FIG. 3 is that the output buffer 28 in FIG. 3 has been replaced with high-drive output buffer 128 in FIG. 4 for 4 of the 8 macrocells. The buffer 128 can source up to 64 milliamps in the output low state and up to 15 milliamps in the output high state. Additional ground bounce protection is also provided. The buffer 128 is also programmable, by a local programmable cell $SL5_x$, to operate either as a 3-state buffer or as an open collector buffer. That is, the user can select individually for each macrocell whether an enabled high output is to drive the lead high or effectively disconnect itself from the lead.

Figure 6:
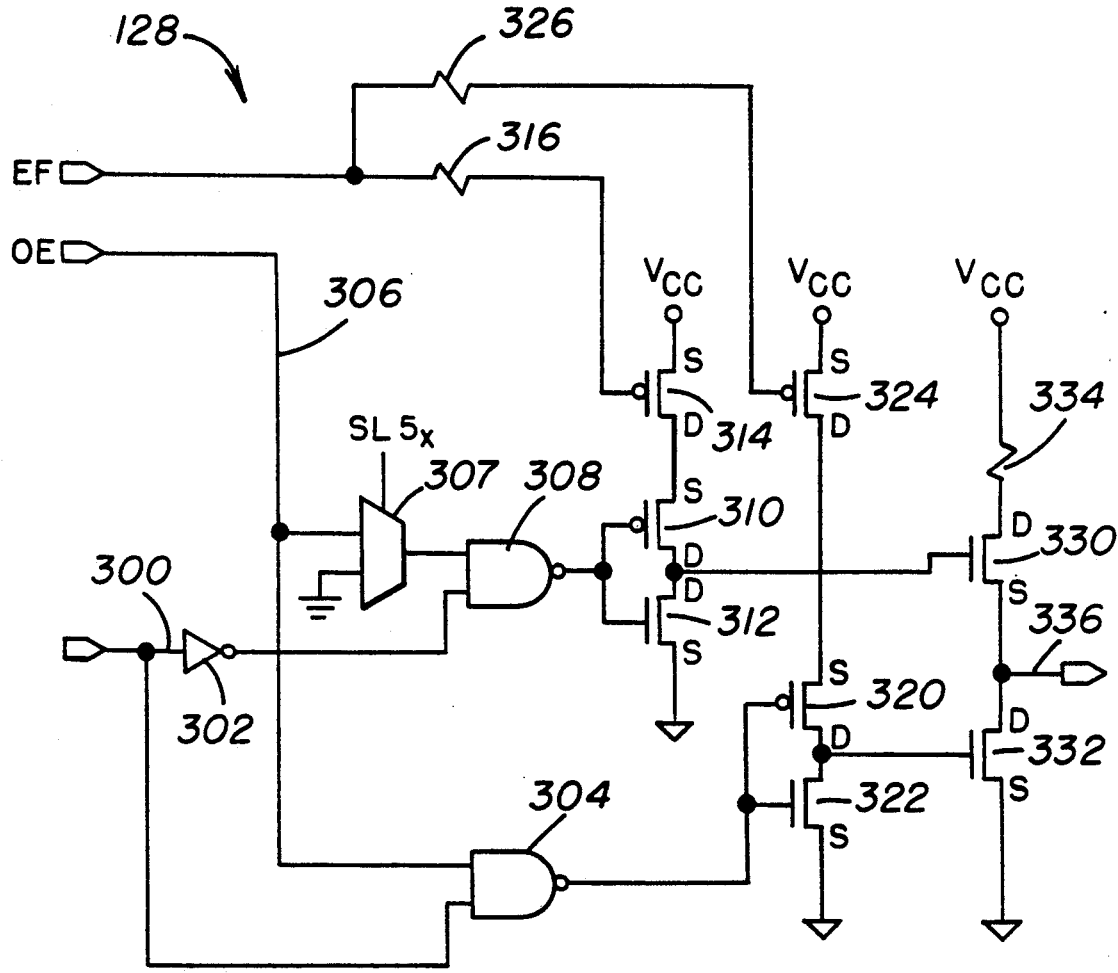
FIG. 6 is a schematic of an output driver shown in FIG. 4.

FIG. 6 shows a detail of the buffer 128. The input 300, from the output multiplexer 144, is connected both to the input of an inverter 302 and one input of a 2-input NAND gate 304. The other input of 2-input NAND gate 304 is connected to the output of a multiplexer 307, which selects between an OE input 306 and ground in response to local fuse $SL5_x$. OE input 306 is the output of OE multiplexer 150 (FIG. 4). The output of inverter 302 is connected to one input of another 2-input NAND gate 308, the other input of which is connected to OE input 306. The output of NAND gate 308 is connected to the gates of both a P-channel transistor 310 and an N-channel transistor 312, the drains of which are connected together. The source of transistor 312 is connected to ground, and the source of transistor 310 is connected to the drain of a transistor 314. The source of transistor 314 is connected to Vcc. The gate of P-channel transistor 314 is connected, through a resistor 316, to a reference voltage VREF.

Similarly, the output of NAND gate 304 is connected to the gates of a P-channel transistor 320 and an N-channel transistor 322, the drains of which are connected together. The source of transistor 322 is connected to ground, and the source of transistor 320 is connected to the drain of another P-channel transistor 324. The source of transistor 324 is connected to Vcc, and the gate of transistor 324 is connected, through a resistor 326, to VREF. The combination of transistor 314 and resistor 316, connected to VREF, improves the resistance of the circuit to ground bounce, as does the combination of transistor 324 and resistor 326 connected to VREF. This is because the slew rate on the gates of transistors 330 and 332 are controlled by means of the series impedance of transistors 314 and 324, respectively, in the pull-up paths for such gates.

The common drains of transistors 310 and 312 are connected to the gate of a large N-channel transistor 330, and the common drains of transistors 320 and 322 ar connected to the gate of another large N-channel transistor 332. The source of transistor 322 is connected to ground, and its drain is connected to the source of transistor 330, the drain of which is connected, through a current limiting pull-up resistor 334, to Vcc. The output 336 of the driver 128 is taken from the junction between the source of transistor 330 and the drain of transistor 332. The transistors 330 and 322 and the resistor 334 are of sizes and values appropriate to permit the output 336 to source up to 64 milliamps in the output low state and up to 15 milliamps in the output high state. As used herein, no restriction on the direction of current flow is intended by the words "source", "sink", and "drive".

The invention has been described with respect to particular embodiments thereof, and numerous modifications can be made which are within the scope of the invention as set forth in the claims.

What is claimed is:

1. A programmable logic device comprising:
   a first integrated circuit package having $P_1$ package leads; and
   a first integrated circuit chip packaged in said first integrated circuit package and having formed thereon a programmable logic circuit having inputs and outputs and having first output driver means for coupling each of said programmable logic circuit outputs to a respective one of said $P_1$ leads, at least one of said output driver means being capable of supplying at least 64 milliamps in the output low state,
   said programmable logic circuit having the same architecture as a pre-existing programmable logic device,
   said pre-existing programmable logic device comprising a second integrated circuit package having $P_0$ package leads, including $G_0$ ground leads, said pre-existing programmable logic device further comprising a second integrated circuit chip packaged in said second integrated circuit package and having formed thereon a programmable logic circuit having inputs and outputs and having second output driver means for coupling each of said programmable logic circuit outputs to a respective one of said $P_0$ leads, none of said second output driver means being capable of supplying more than approximately 24 milliamps in the output low state.

2. A Programmable logic device according to claim 1, wherein $P_1 > P_0$.

3. A Programmable logic device according to claim 2, wherein $G_1$ of said $P_1$ package leads on said first integrated circuit package are ground leads, $G_1 > G_0$.

4. A programmable logic device comprising:
a first integrated circuit package having $P_1$ package leads; and
a first integrated circuit chip packaged in said first integrated circuit package and having formed thereon a first programmable logic circuit having inputs and outputs and having first output driver means for coupling each of said first programmable logic circuit outputs to a respective one of said $P_1$ leads, at least one of said first output driver means being capable of supplying at least 64 milliamps in the output low state, at least one of said first output driver means being further capable of supplying at least 15 milliamps in the output high state,
said first programmable logic circuit having at least the features of a pre-existing programmable logic circuit formed within a pre-existing programmable logic device,
said pre-existing programmable logic device comprising a second integrated circuit package having $P_0$ package leads, and a second integrated circuit chip packaged in said second integrated circuit package and having the pre-existing programmable logic circuit formed thereon, the pre-existing programmable logic circuit having inputs and outputs and having second output driver means for coupling each of said pre-existing programmable logic circuit outputs to a respective one of said $P_0$ leads, none of said second output driver means being capable of supplying more than approximately 24 milliamps in the output low state.

5. A Programmable logic device according to claim 4, wherein at least two of said $P_1$ package leads are coupled to said first integrated circuit chip to provide ground to said first integrated circuit chip.

6. A programmable logic device according to claim 5, wherein at least two of said $P_1$ package leads are coupled to said first integrated circuit chip to provide a power supply voltage to said first integrated circuit chip.

7. A Programmable logic device according to claim 4, further comprising hysteresis means coupled between one of said $P_1$ package leads and one of said inputs to said first programmable logic circuit.

8. A Programmable logic device according to claim 4, further comprising:
means for selectably decoupling said one of said first output drivers from said one of said $P_1$ package leads; and
a feedback path for coupling said one of said $P_1$ package leads to one of said inputs of said first programmable logic circuit.

9. A programmable logic device according to claim 8, wherein said one of said first output driver means comprises a pull-up device and means for selectably coupling or decoupling said pull-up device to said one of said $P_1$ package leads when said one of said first output driver means outputs a high logic signal.

10. A programmable logic device according to claim 4, further comprising ground bounce protection means for protecting said one of said first output driver means from ground bounce.

11. A programmable logic device comprising:
a first integrated circuit package having $P_1$ package leads; and
a first integrated circuit chip packaged in said first integrated circuit package and having formed thereon a first programmable logic circuit having inputs and outputs and having first output driver means for coupling each of said programmable logic circuit outputs to a respective one of said $P_1$ leads, at least one of said first output driver means being capable of supplying at least 64 milliamps in the output low state,
said first integrated circuit chip further having formed thereon a plurality of storage devices each coupled to store a signal from a respective one of said $P_1$ leads and to provide said stored signal to a respective one of said inputs of said first programmable logic circuit, each of said storage devices including a control input, said control inputs of all of said storage devices being coupled together,
said first integrated circuit chip further having formed thereon means for bypassing individually selectable ones of said storage means,
said first programmable logic circuit having at least the features of a pre-existing logic circuit formed within a pre-existing programmable logic device,
said pre-existing programmable logic device comprising a second integrated circuit package having $P_0$ package leads, and a second integrated circuit chip packaged in said second integrated circuit package and having the pre-existing programmable logic circuit formed thereon, the pre-existing programmable logic circuit having inputs and outputs and having second output driver means for coupling each of said pre-existing programmable logic circuit outputs to a respective one of said $P_0$ leads, none of said second output driver means being capable of supplying more than approximately 24 milliamps in the output low state.

12. A programmable logic device according to claim 11, wherein each of said storage devices is a transparent latch.

13. A programmable logic device comprising:
a first integrated circuit package having $P_1$ package leads;
a first integrated circuit chip packaged in said first integrated circuit package and having formed thereon a first programmable logic circuit having inputs and outputs and having first output driver means for coupling each of said programmable logic circuit outputs to a respective one of said $P_1$ leads, at least one of said first output driver means being capable of supplying at least 64 milliamps in the output low state, each given one of said first output driver means comprises a pull-up device and means for selectably coupling or decoupling said pull-up device to said respective one of said $P_1$ package leads when said given one of said first output driver means outputs a high logic signal;
a plurality of transparent input latches each coupled to store a signal from a respective one of said $P_1$ package leads and to provide said stored signal to a respective one of said inputs of said first programmable logic circuit, each of aid latches including a latch enable input, the latch enable inputs of all of said latches being coupled together; and means for bypassing individually selectable ones of said transparent input latches, said programmable logic circuit having at least the features of a pre-existing programmable logic circuit formed within a pre-existing programmable logic device, said pre-existing programmable logic device comprising a second integrated circuit package having $P_0$ package leads, and a second integrated circuit chip packaged in said second integrated circuit package and having the pre-existing programmable logic circuit formed thereon, the pre-existing programmable logic circuit having inputs and outputs and having second output driver means for coupling each of said pre-existing programmable logic circuit outputs to a respective one of said $P_0$ leads, none of said second output driver means being capable of supplying more than approximately 24 milliamps in the output low state.

14. A programmable logic device comprising:

a first integrated circuit package having $P_1$ package leads; and a first integrated circuit chip packaged in said first integrated circuit package and having formed thereon a programmable logic circuit having inputs and outputs and having first output driver means for coupling each of said programmable logic circuit outputs to a respective one of said $P_1$ leads, at least one of said first output driver means being capable of supplying at least 64 milliamps in the output low state, said programmable logic circuit comprising a 16V8.

15. A programmable logic device according to claim 14, wherein $P_1 = 24$.

16. A programmable logic device according to claim 15, wherein at least three (3) of said $P_1$ package leads are ground leads.

17. A programmable logic device according to claim 16, wherein exactly 3 of said $P_1$ package leads are coupled to said chip to provide a power supply voltage to said chip.

18. A method of making a programmable logic device comprising the steps of:

selecting a pre-existing first programmable logic device, said pre-existing device including a first package type having no more than $P_1$ package leads, $G_1$ of which are for supplying ground current to said first device, a programmable logic circuit having inputs and outputs and having first output driver means for coupling each of said programmable logic circuit outputs to a respective one of said $P_1$ leads, none of said first output driver means being capable of supplying more than approximately 24 milliamps in the output low state;

designing a second programmable logic device which contains at least the features of said first programmable logic device, said second programmable logic device further including at least one output driver capable of supplying at least 64 milliamps in the output low state;

packaging said second programmable logic device in a package having $P_2$ leads, $G_2$ of which are for supplying ground current to said second device; wherein $P_2 > P_1$ and $G_2 > G_1$.

19. A method according to claim 18, wherein said second programmable device includes at least four output drivers capable of supplying at least 64 milliamps in the output low state.

20. A method according to claim 19, wherein at least four of said package leads on said second programmable logic device are configurable as package inputs, further comprising the step of providing hysteresis on at least four of said package leads on said second programmable logic device which are configurable as package inputs.

21. The combination of first and second programmable logic devices, said first programmable logic device comprising a first programmable integrated circuit packaged in a first package type, said first integrated circuit package type having $P_1$ first package leads, said first programmable integrated circuit having a first power node connected to $V_1$ of said first package leads, a first ground node connected to $G_1$ of said first package leads, and a plurality of first signal nodes each connected to a respective one of the remainder of said first package leads, said first integrated circuit further including a plurality of first output drivers for driving some of said first signal nodes, none of the output drivers in said first integrated circuit being capable of driving more than approximately 24 milliamps in the output low state, and said second programmable logic device comprising a second programmable integrated circuit packaged in a second package type, said second integrated circuit package type having $P_2$ second package leads, said second programmable integrated circuit having a second power node connected to $V_2$ of said second package leads, a second ground node connected to $G_2$ of said second package leads, and a plurality of second signal nodes each connected to a respective one of the remainder of said second package leads, said second integrated circuit further including a plurality of second output drivers for driving some of said second signal nodes, wherein said second programmable integrated circuit has at least the same architectural features as said first programmable integrated circuit, wherein at least one of said second output drivers is capable of driving 64 milliamps in the output low state, and wherein $P_2 > P_1$ and $G_2 > G_1$.

22. A combination according to claim 21, wherein $V_2 > V_1$.

23. A programmable logic device for use with a common input latch enable signal, comprising:

a logic circuit having logic circuit inputs and logic circuit outputs;

a plurality of externally connectable leads; and a first plurality of input circuits, each coupled between one of said leads and a respective one of said logic circuit inputs, and each operable in a first mode as a latch operating responsively to said common input latch enable signal or in a second mode as a signal path unresponsive to said common input latch enable signal; and programmable means for causing each of said input circuits individually to operate in selectable said first or second mode.

24. A programmable logic device according to claim 23, further comprising a second plurality of output circuits, each coupled between one of said logic circuit outputs and a respective one of said leads to which one of said input circuits is coupled, each of said output circuits comprising means for selectable driving or not driving said respective one of said leads to a desired respective logic level.

25. A programmable logic device according to claim 24, wherein at least one of said output circuits is capable of driving said respective one of said leads with at least 64 milliamps in the output low state.

* * * * *